United States Patent
Peh et al.

(10) Patent No.: US 12,549,158 B2
(45) Date of Patent: Feb. 10, 2026

(54) RING OSCILLATOR BASED DIGITALLY CONTROLLED OSCILLATOR

(71) Applicant: Silicon Laboratories Inc., Austin, TX (US)

(72) Inventors: Sheng Jue Peh, Singapore (SG); Jeffrey L. Sonntag, Weaverville, NC (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 18/648,669

(22) Filed: Apr. 29, 2024

(65) Prior Publication Data

US 2025/0337395 A1    Oct. 30, 2025

(51) Int. Cl.
*H03K 3/03*   (2006.01)
*H03L 7/099*  (2006.01)

(52) U.S. Cl.
CPC ......... *H03K 3/0315* (2013.01); *H03L 7/0991* (2013.01); *H03L 7/0995* (2013.01)

(58) Field of Classification Search
CPC ... H03K 3/0315; H03K 3/0322; H03L 7/0995
USPC ........................................................... 331/57
See application file for complete search history.

(56) References Cited

U.S. PATENT DOCUMENTS

| | | | | |
|---|---|---|---|---|
| 6,020,781 A * | 2/2000 | Fujioka | ................... | H02M 3/07 365/189.11 |
| 6,157,267 A * | 12/2000 | Kakimura | ............ | H03K 3/0315 331/34 |
| 6,359,519 B1 * | 3/2002 | Farrow | ................ | H03K 3/0315 331/25 |
| 6,459,327 B1 * | 10/2002 | Yamada | ................. | H03K 3/354 327/276 |
| 6,622,256 B1 * | 9/2003 | Dabral | ................... | H03K 5/133 713/401 |
| 7,659,783 B2 * | 2/2010 | Tai | ........................ | H03L 7/0998 331/46 |
| 2008/0012647 A1 * | 1/2008 | Risbo | ...................... | H03L 7/093 331/16 |
| 2021/0111729 A1 * | 4/2021 | Parvizi | .................. | H03L 7/0995 |
| 2023/0308112 A1 * | 9/2023 | Harush | ................. | H03L 7/0995 |

\* cited by examiner

*Primary Examiner* — Levi Gannon
(74) *Attorney, Agent, or Firm* — Zagorin Cave LLP

(57) ABSTRACT

A ring oscillator has a first group of inverters that receive respective frequency control signals to control delays through the inverters. The frequency of the ring oscillator is dithered according to least significant bits of a frequency control word supplied by a loop filter of a phase-locked loop. Most significant bits of the frequency control word are used to generate the frequency control signals. An accumulator is clocked by an output of the ring oscillator and accumulates the least significant bits of the frequency control word. A selector circuit selects either N most significant bits of the frequency control word or the N most significant bits of the frequency control word +1 according to the selector signal to generate the frequency control signals.

19 Claims, 8 Drawing Sheets

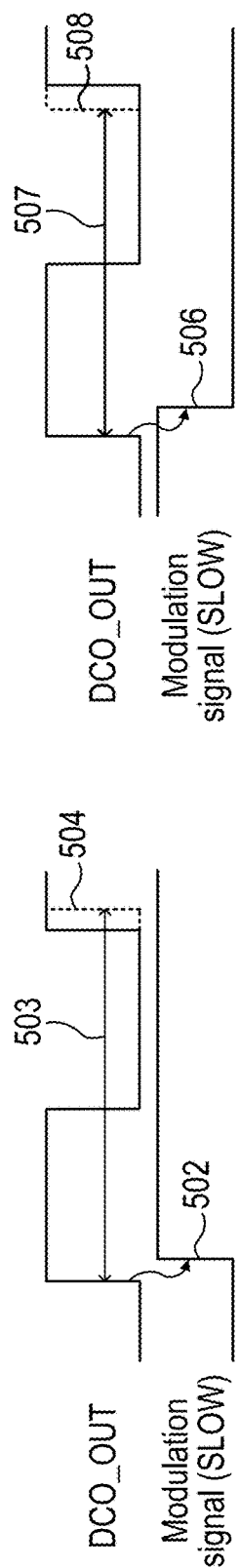
Fig. 5A
Fig. 5B
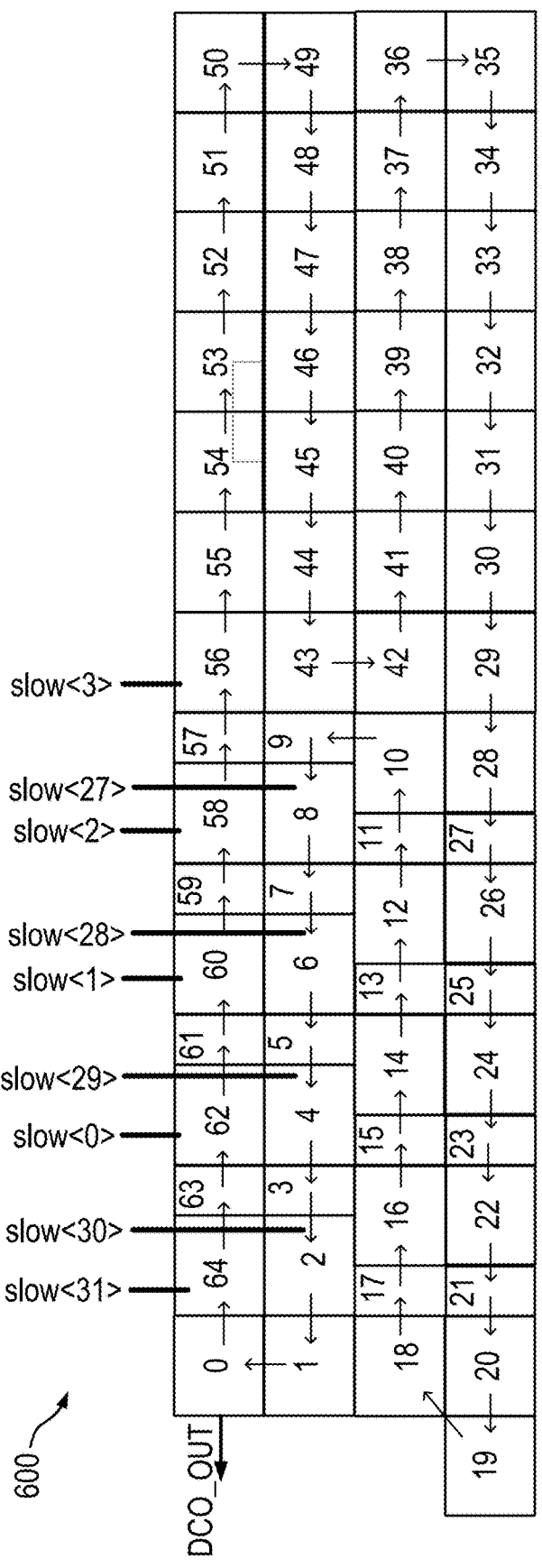
Fig. 6

RING OSCILLATOR BASED DIGITALLY CONTROLLED OSCILLATOR

BACKGROUND

Field of the Invention

This disclosure relates to ring oscillators and more particular to a ring oscillator that supports frequency switching.

Description of the Related Art

Ring oscillators have been used as a digitally controlled oscillator (DCO) in a phase-locked loop (PLL). The ring oscillator typically includes an odd number of inverter stages. To ensure a constant delay through each stage of the ring oscillator, a capacitive digital to analog converter (CDAC) or a resistive DAC (RDAC) can be used to evenly load all stages of the ring oscillator. However, those approaches can lead to delays causing non-linearity issues in the DCO. Accordingly, improvements in the ring oscillator are desired.

SUMMARY OF EMBODIMENTS OF THE INVENTION

Accordingly, an embodiment includes a ring oscillator having a plurality of inverter stages and the ring oscillator supplying a ring oscillator output signal. A first group of the plurality of inverter stages is coupled to receive respective frequency control signals to control respective delays through the first group of inverter stages. A change in one or more of the frequency control signals is reflected in the ring oscillator output signal within one ring oscillator output signal cycle of the change A second group of the plurality of inverters stages has delays that are static during operation of the ring oscillator.

In another embodiment a method includes supplying respective frequency control signals to a first group of inverter stages of a ring oscillator. The first group of inverter stages being either even or odd inverter stages. Respective delays through the first group of inverter stages are controlled using the respective frequency control signals. A frequency of a ring oscillator output signal changes in response to a change in one or more of the frequency control signals, the frequency changing within one ring oscillator output signal cycle of the change in the one or more frequency control signals. A second group of inverter stages uses static delays during operation of the ring oscillator.

In another embodiment an apparatus includes a ring oscillator that has a plurality of inverter stages and supplies a ring oscillator output signal. A first group of even inverter stages of the plurality of inverter stages of the ring oscillator are coupled to receive respective frequency control signals to modulate respective delays through the first group of inverter stages. A second group of inverter stages have static delays during operation of the ring oscillator. An accumulator accumulates least significant bits of a frequency control word. Most significant bits of the frequency control word are used in generation of the frequency control signals. The least significant bits of the frequency control word are used to dither a frequency of the ring oscillator output signal by causing 1 to be added to the most significant bits of the frequency control word responsive to a value of the accumulator reaching a predetermined value.

BRIEF DESCRIPTION OF THE DRAWINGS

The present invention may be better understood, and its numerous objects, features, and advantages made apparent to those skilled in the art by referencing the accompanying drawings.

FIG. 5A illustrates the effect of the modulation of an inverter stage assuming the rising edge of the inverter stage is being modulated to slow the DCO output.

FIG. 5B illustrates the effect of the modulation of an inverter stage assuming the rising edge of the inverter stage is being modulated to speed up the DCO output.

FIG. 6 illustrates an example layout of an embodiment of a ring oscillator.

The use of the same reference symbols in different drawings indicates similar or identical items.

DETAILED DESCRIPTION

Embodiments herein allow high speed dithering of a digitally controlled oscillator (DCO) to reduce quantization noise and increase resolution of the tunable DCO. Embodiments of the DCO described herein perform code switching to change the output frequency within one cycle of the DCO output signal. Thus, e.g., when a frequency change is desired, a code switch (to change the frequency) occurs responsive to a rising edge of the DCO output signal and the frequency change takes effect within one cycle of the DCO output signal. That allows high speed dithering of the DCO with reduced non-linearity errors. Use of a DCO implemented as a ring oscillator as described herein also reduces design complexity and matching requirements and allows use of a more coarse DCO that still achieves good performance. Embodiments of the ring oscillator described herein require a relatively small area footprint as compared to, e.g., a DCO using a CDAC/RDAC. Embodiments of the DCO described herein maintain good linearity during code switches due to the timing of the code switching that takes place. If just tunable delay stages were used without considering when the timing of the tuning signals arrive, the variable delay of when the frequency of the ring oscillator changes would introduce non-linearity errors.

Figure 1:
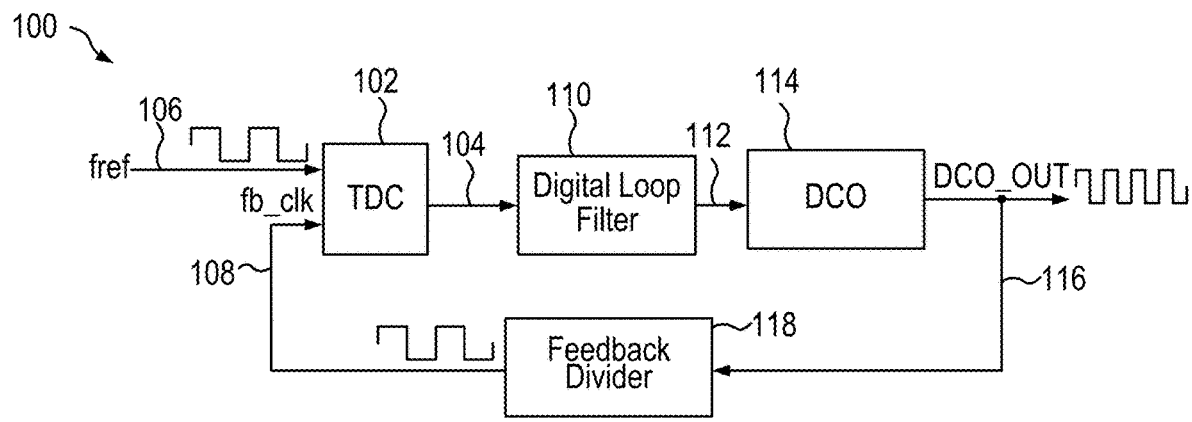
FIG. 1 illustrates a PLL incorporating an embodiment of the ring oscillator.

FIG. 1 illustrates an embodiment of a PLL 100 incorporating an embodiment of the ring oscillator. The PLL 100 includes a time-to-digital converter (TDC) 102 that supplies a phase error 104 representing the phase difference between the reference signal (fref) 106 and the feedback signal (fb_clk) 108. The digital loop filter 110 receives the phase error 104 and supplies a digital control signal 112 to control the DCO 114. The feedback divider 118 receives the DCO_OUT signal 116 and generates the feedback signal 108.

Figure 2:
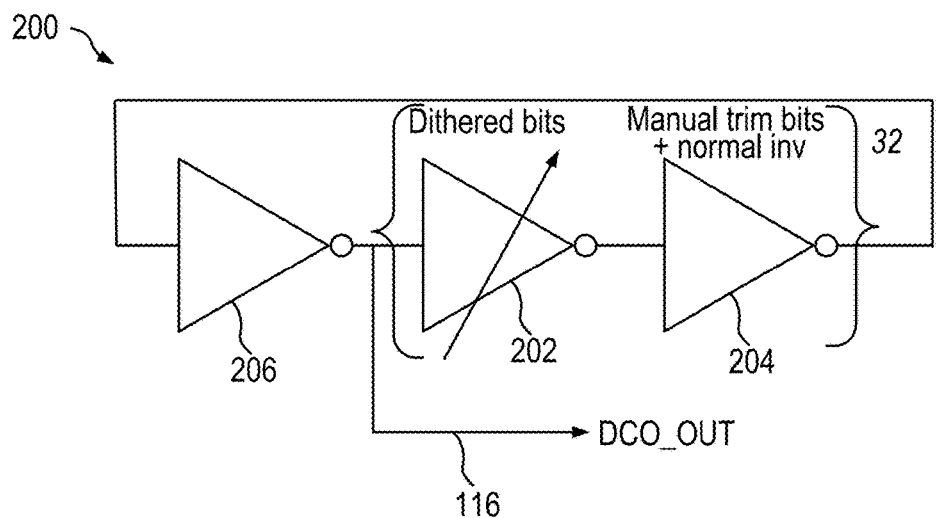
FIG. 2 illustrates a ring oscillator that implements the DCO of FIG. 1.

FIG. 2 illustrates a ring oscillator 200 that implements DCO 114. The ring oscillator 200 includes a first plurality of inverter stages 202 that are dithered stages (having a delay that changes or can change during operation) and a second plurality of stages 204 that are manually trimmed or plain inverters but whose delay is static during operation. In an embodiment there are an equal number of stages 202 and 204 and an additional stage 206 provides an odd number of stages. In the embodiment illustrated in FIG. 2, stage 206 supplies the DCO_OUT signal 116.

Figure 3:
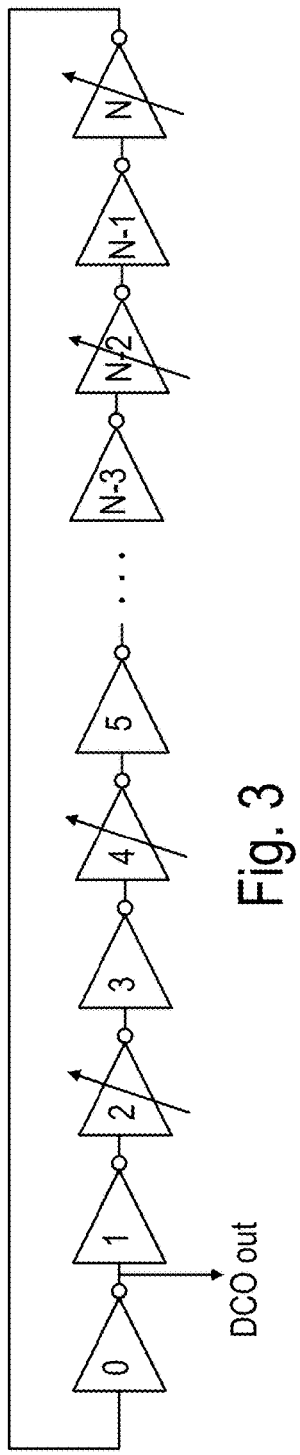
FIG. 3 illustrates additional details of an embodiment of a ring oscillator.

FIG. 3 illustrates additional details of a ring oscillator 300 according to an embodiment. The ring oscillator 300 includes N+1 stages, where N is an even integer. The odd stages (1, 3, 5, etc.) have delays that are fixed during operation but at least some of the odd stages include the capability to be programmably trimmed either in manufacturing or in the field or both. The even stages (2, 4, . . . , N−2, N) are the stages that are capable of supporting high speed dithering of the DCO output as explained more fully herein. For ease or reference, a "dithered" stage is a stage that is capable of having its delay changed during operation to increase or decrease the frequency of the DCO within a next DCO cycle after the modulation signal changes its value. Of course, in other embodiments the dithered stages are the odd stages. In either embodiment, a dithered stage is immediately adjacent to non-dithered stages as shown in FIG. 3.

Figure 4:
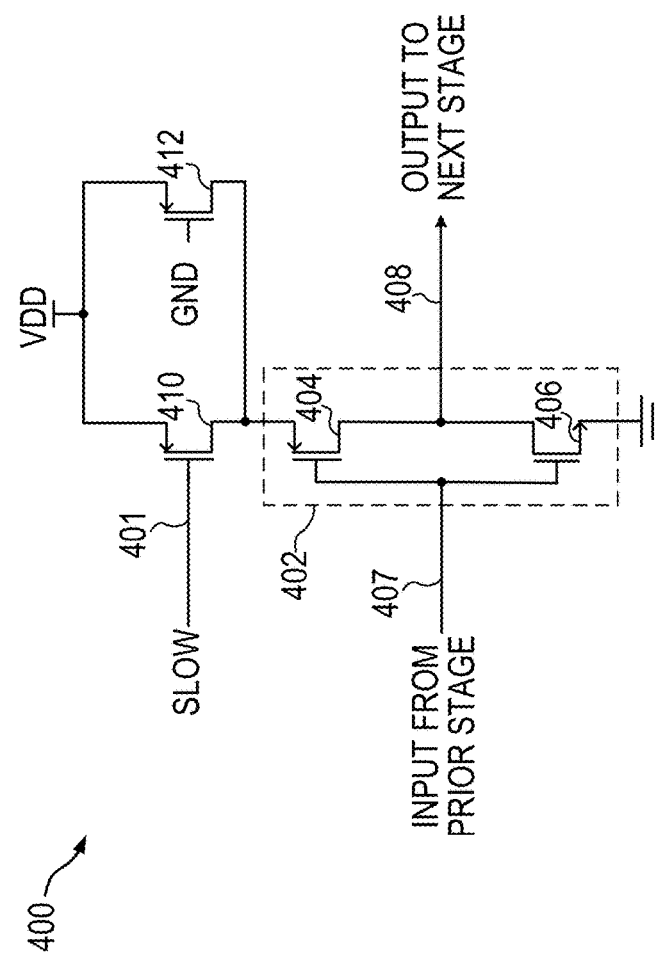
FIG. 4 illustrates an embodiment of a ring oscillator stage having a controllable delay controlled with a modulation signal.

FIG. 4 illustrates an embodiment of a ring oscillator inverter stage 400 that is a dithered stage that can have its delay modulated using the SLOW signal 401. The inverter stage 400 includes a conventional inverter 402 formed by a P-channel metal-oxide semiconductor (PMOS) transistor 404 and an N-channel metal-oxide semiconductor (NMOS) transistor 406. Both transistors 404 and 406 receive the input 407 to the inverter stage 400 from the prior stage as their gate input. Transistors 404 and 406 have their drains coupled to the output 408 that is the input to the next stage. The inverter stage 400 further includes the PMOS transistor 410 having its gate coupled to the modulation signal shown as SLOW signal 401. The SLOW signal modulates the delay of the inverter stage. PMOS transistor 412 has its gate coupled to ground and thus is always on. The relative sizes of transistors 410 and 412 can vary according to the needs of the particular implementation. In at least one embodiment, the channel width of transistor 410 is wider than the channel width of transistor 412. In other embodiments the transistors are sized equally. In still other embodiments transistor 412 has a wider channel width. The combination of transistors should be chosen to achieve the center frequency and step size desired. Deasserting the SLOW signal (setting it low) turns on transistor 410 and thus decreases the ON resistance of the rising edge of the output 408. Deasserting the SLOW signal (low) makes the inverter stage 400 faster and asserting the SLOW signal (setting it high) turns off transistor 410 thereby increasing the ON resistance and delaying the rising edge of the output, thus slowing the inverter stage. Note that the exact design of the delay stage can be done in various ways as known to those of skill in the art as long as only either the rising edge or the falling edge of the inverter stage output signal is adjusted responsive to the modulation signal. A key aspect of the inverter stage shown in FIG. 4 is the conductive path between the actual supply voltage VDD and the supply voltage for the inverter structure formed by the PMOS transistor 404 and the NMOS transistor 406. In FIG. 4 that conductive path is formed by transistors 410 and 412. That path takes on a multiplicity of conductivities depending on the digital control input (SLOW signal 401). Alternative embodiments for the conductive path replace the grounded gate PMOS transistor 412 with a resistor or with a PMOS transistor with a gate at a non-GND bias voltage.

Referring back to FIG. 3, in an embodiment only half of the inverter stages are capable of being dithered and have the configuration shown in inverter stage 400. Note that the modulation of the inverter stage only affects the rising edge inverter stage 400 as the output of the inverter stage is being pulled to VDD. Other embodiments affect only the falling edge and thus the pull-down structure has extra transistors in parallel between the source of transistor 406 and ground and one of the extra transistors is always on and another is controlled by a modulation signal. Various other delay implementations can be used but such implementations should only affect one edge of the output signal, either the rising edge or the falling edge.

FIG. 5A illustrates the effect of the modulation of an inverter stage assuming the rising edge of the inverter stage is being modulated. The control logic (not shown) supplying the SLOW signal changes the SLOW signal responsive to the rising edge of the DCO_OUT signal. When the SLOW signal is asserted at 502 responsive to the rising edge of the DCO_OUT signal, the next rising edge 504 of DCO_OUT reflects the change in frequency. When transistor 410 is turned off by asserting the modulation signal SLOW, the next rising edge of DCO_OUT occurs later (at 504) than it would without the assertion of SLOW. That results in a longer period for DCO_OUT and thus a lower frequency. FIG. 5B illustrates the control logic (not shown) that supplies the SLOW signal changes the SLOW signal at 506 responsive to the rising edge of the DCO_OUT signal. When the SLOW signal is deasserted (low) responsive to the rising edge of the DCO_OUT signal, the next rising edge of DCO_OUT reflects the change in frequency. Thus, with transistor 410 turned on by deasserting SLOW, the next rising edge of DCO_OUT occurs earlier (at 508) than it would with SLOW remaining asserted. The earlier rising edge results in a shorter period for DCO_OUT and thus a higher frequency.

The timing margin for the change in the next rising edge varies according to the location of the dithered inverter stage in the ring oscillator. FIG. 6 illustrates an example layout of an embodiment of a ring oscillator 600. In an embodiment, there are 32 inverter stages that can be dithered and 32 inverter stages that cannot be dithered and another inverter stage (0) that supplies the output. The arrows in FIG. 6 show the direction of flow in the ring oscillator. For example, inverter stage 0 supplies its output to inverter stage 64, which supplies its output to inverter stage 63, etc. Inverter stage 64 has the shortest timing margin (approximately a half period) for its next rising edge to be delayed or advanced. In contrast, inverter stage 2 has the longest timing margin (close to a period) to meet the timing for its next rising edge to be delayed or advanced. FIG. 6 illustrates some of the 32 SLOW signals supplied to the ring oscillator 600. Inverter stage 64 receives SLOW<31>, inverter stage 62 receives SLOW<0>, inverter stage 60 receives SLOW<1>, inverter stage 58 receives SLOW<2>, inverter stage 56 receives SLOW<3>, inverter stage 2 receives SLOW<30>, inverter stage 4 receives SLOW<29>, inverter stage 6 receives SLOW<28>, inverter stage 8 receives SLOW<27>. SLOW<30> corresponds to the highest DCO frequency and SLOW<31> corresponds to the slowest DCO frequency. The higher frequency SLOW signals correspond to those ring oscillator stages with the most timing margin. Note that in some embodiments some of the inverter stages in ring oscillator 600 are larger than others. For example, in at least one embodiment the dithered inverter stages are the largest. At least some of the inverter stages that cannot be dithered can still be trimmed to adjust their delay but are not trimmed for dithering purposes. They can be trimmed, e.g., in manufacturing or in the field for a particular application. In embodiments, at least some of the inverter stages that cannot be dithered are conventional inverters, shown, e.g., as inverter 402 in FIG. 4, which stage is the smallest stage (e.g., stages 3, 5, 7, and 9) shown in FIG. 6 in terms of the number of devices needed to form the stage as compared to the dithered inverter stages. In other embodiments the inverter stages are the same size.

In the embodiment illustrated in FIG. 6 there are 32 SLOW signals, one SLOW signal for each of the 32 dithered inverter stages that can be modulated and the SLOW signals are thermometer encoded. In an embodiment, an N bit frequency code from the loop filter specifies the frequency of the ring oscillator and an N bit to M bit thermometer code encoder is used to generate the M SLOW signals. In the example of FIGS. 6, N=5 and M=32. For the thermometer encoding, for each increase in the value of the frequency code representing an increase in frequency, one or more additional SLOW bits are deasserted to correspond to the size of the increase in frequency and for each decrease in the value of the N bit frequency code representing a decrease in frequency, one or more additional SLOW bits are asserted to correspond to the decrease in frequency. For example, if the value of the frequency code increases by 2, e.g., from 15 to 17, two extra SLOW signals are deasserted and if the frequency code decreases by one, e.g., from 17 to 16, one additional SLOW signal is asserted.

Figure 7:
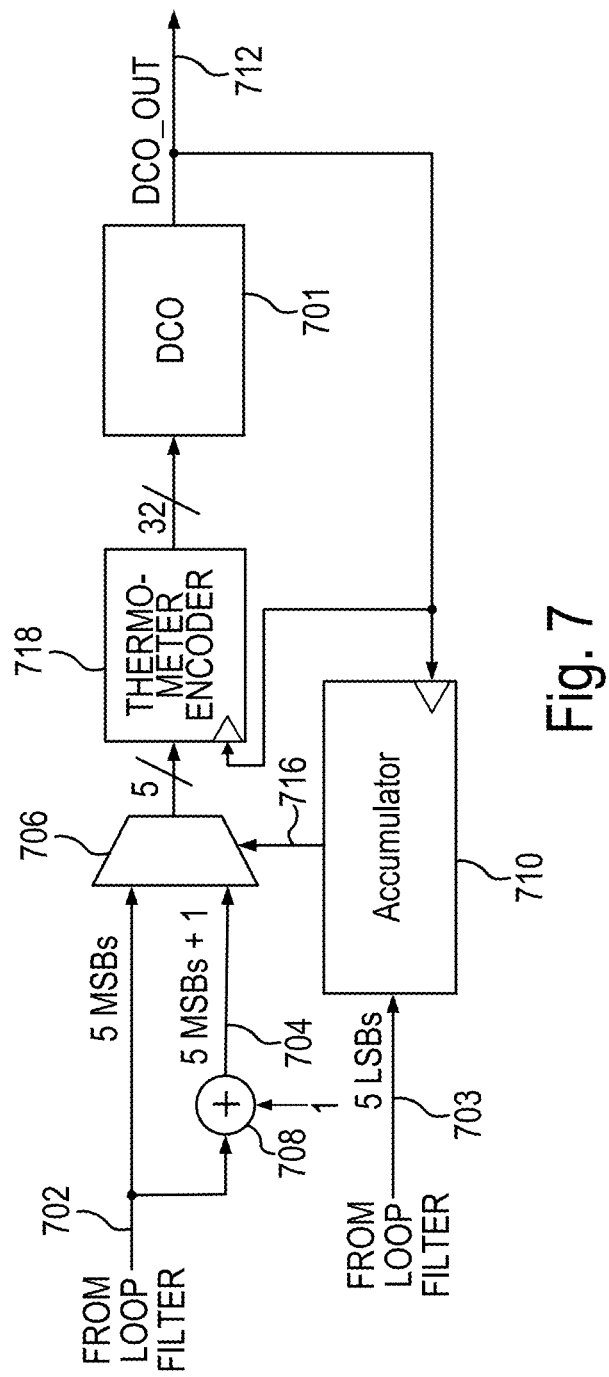
FIG. 7 illustrates a block diagram of an embodiment that dithers the DCO output using the least significant bits of the frequency code supplied by the digital loop filter.

FIG. 7 illustrates a block diagram of an embodiment that dithers the DCO 701 using the least significant bits of the frequency code supplied by the digital loop filter. The DCO 701 has, e.g., the ring oscillator structure shown in FIG. 3. In the illustrated embodiment, the digital loop filter supplies a 10 bit digital frequency control word as a frequency code to control the frequency of the DCO. The 5 most significant bits (MSBs) 702 of the frequency control and the (5 MSBs+1) 704 are supplied to the selector circuit 706. Summer 708 adds "1" to the 5 MSBs. The five least significant bits (LSBs) 703 of the frequency control word are supplied to the accumulator 710, which is clocked by the DCO_OUT signal 712. In one or more embodiments, the DCO_OUT signal 712 is divided, e.g., by two, and the divided DCO_OUT signal is used to clock the accumulator. The accumulator 710 accumulates the five LSBs 703 and assertion of the carry out 716 causes selector circuit 706 to select the 5 MSBs+1. The accumulator is a 1st order delta sigma (ΔΣ) modulator. When the carry out 716 is not asserted, the selector circuit 706 selects the 5 MSBs. The output of the selector circuit 802 is supplied to the thermometer encoder 718 that generates the 32 frequency control bits supplied to the DCO 701. The selector circuit path functions to reduce the circuit delay to the thermometer encoder 718. The accumulator 710, the summer 708, and selector circuit 706 in FIG. 7 function to dither the output of the DCO between frequencies. Clocking the accumulator at the frequency of the DCO_OUT signal allows high speed dithering of the DCO to reduce quantization noise associated with the ΔΣ modulator and improve resolution of the tunable oscillator. The output phase of the DCO 701 is obtained by integrating the frequency controls (which is what the DCO does). From a standard analysis of a first order ΔΣ modulator, the integration introduces a null at DC in the frequency response of the quantization noise (as seen in the phase domain), thereby eliminating much of the quantization noise.

Figure 8:
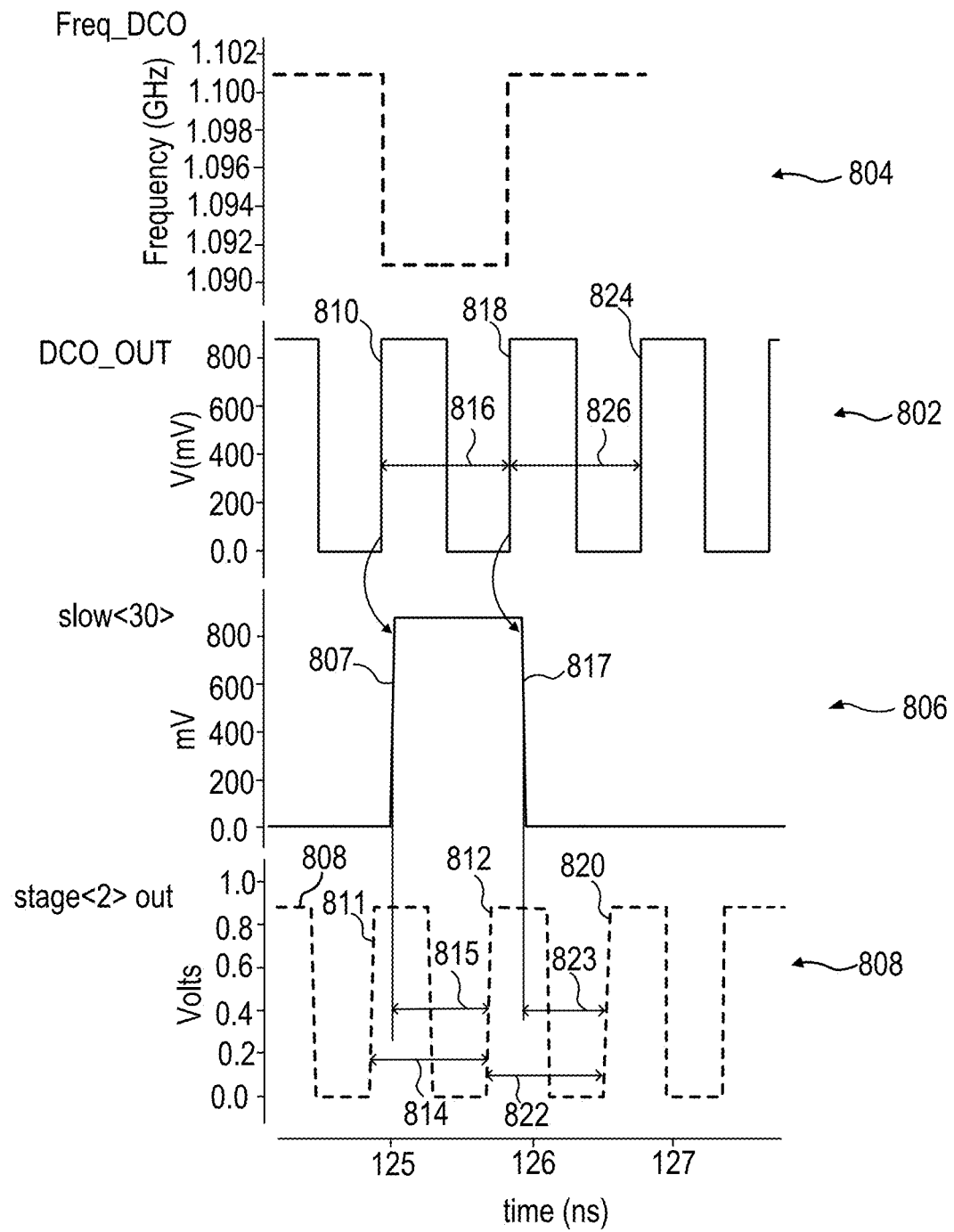
FIG. 8 illustrates timing associated with asserting one of the modulation signals slow<30>.

FIG. 8 illustrates timing associated with asserting the slow<30> signal shown controlling inverter stage<2> in FIG. 6. The slow<30> signal, which has the most timing margin, controls inverter stage<2>, which is close to the end of the inverter chain. The DCO_OUT signal is shown at 802. The frequency of the DCO_OUT signal is shown at 804. The output of stage<2> is shown at 808. Note that the DCO_OUT signal is a slightly delayed version of stage<2> but the delay is exaggerated in FIG. 8 to facilitate understanding of the sequence. The slow<30> signal 806 asserts at 807 responsive to the rising edge DCO_OUT at 810. The assertion of slow<30> occurs after the rising edge of stage<2> out at 811 and the assertion of slow<30> causes the rising edge of the output of stage<2> at 812 to be delayed thereby causing a longer period 814 and a lower frequency. The timing margin from the rising edge 807 of slow<30> to the rising edge 812 of stage<2> out is shown at 815 and is close to a whole period of stage<2> out. The longer period 814 in turn causes the period 816 of DCO_OUT to be longer to provide a lower frequency of DCO_OUT responsive to assertion of the slow signal. The slow signal deasserts at 817 responsive to the rising edge of DCO_OUT at 818 (and the control logic determination to increase the frequency of DCO_OUT responsive to, e.g., dithering due to the LSBs of the frequency code). The deassertion of the slow signal results in the rising edge of stage<2> out at 820 to occur earlier thereby making the period 822 shorter. The timing margin between the falling edge 817 of slow<30> and the rising edge 820 of stage<2> out is shown at 823. The shorter period 822 results in the rising edge of DCO_OUT to occur more quickly at 824 thereby increasing the frequency of DCO_OUT responsive to deassertion of the slow signal. Thus, the frequency of DCO_OUT can be seen to decrease for one cycle 816 and then increase for the next cycle 826. Note that the frequency change of the inverter stage always occurs by the next rising edge of the inverter stage output after assertion of deassertion of the SLOW signal. That results in DCO_OUT changing within one DCO cycle of the assertion or deassertion of the slow signal (code switch). Thus, the slow signal change at 807 results in the frequency changing in period 816 and the deassertion of the slow signal at 817 results in the frequency changing in period 826. That quick response to the frequency change request through the slow signal helps ensure high speed dithering capability.

Figure 9:
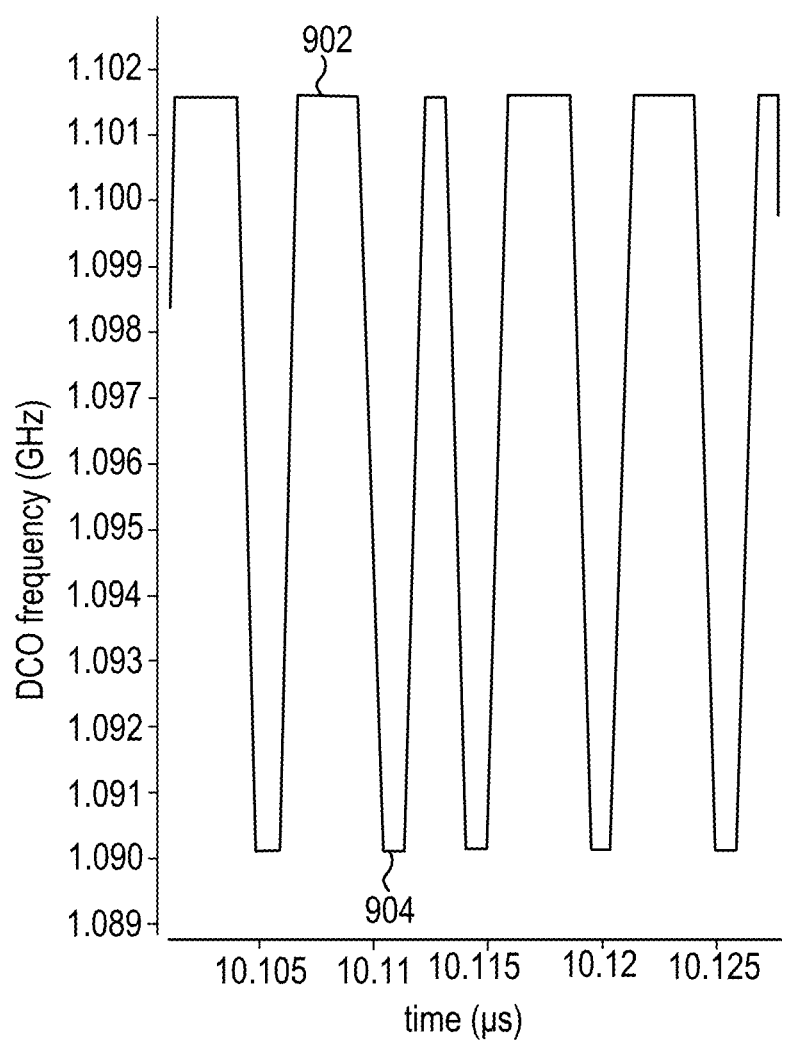
FIG. 9 illustrates the delay free frequency change of the DCO output.

FIG. 9 illustrates the delay free frequency change of DCO_OUT in a manner consistent with dithering based on the least significant bits of the frequency control word supplied by the digital loop filter. The PLL structure supports high speed dithering using the accumulator clocked at the frequency of DCO_OUT. Other embodiments use half the frequency of DCO_OUT. In the example of FIG. 9 the frequency shifts between the high frequency of approximately 1.1015 GHZ at 902 and the low frequency of approximately 1.090 GHz at 904.

Figure 10:
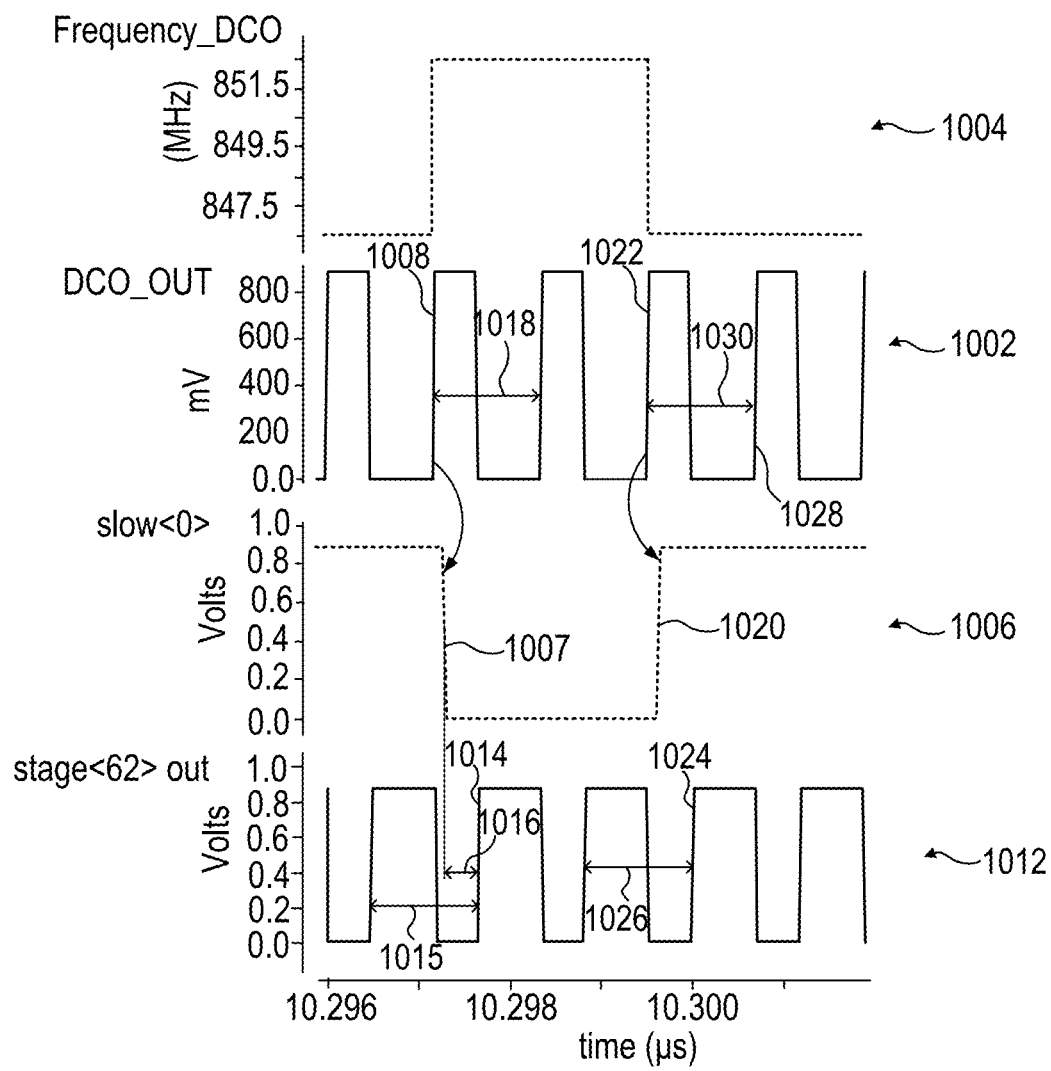
FIG. 10 illustrates timing associated with deasserting one of the modulation signals slow<62>.

FIG. 10 illustrates timing associated with deasserting the slow<0> signal shown as controlling inverter stage<62> in FIG. 6. The slow<0> signal has one of the smallest timing margins and controls the inverter stage stage<62>, which is close to the beginning of the inverter chain. The DCO_OUT signal is shown at 1002. Note that the output of stage<62> is a slightly delayed and inverted version of DCO_OUT. The frequency of the DCO_OUT signal is shown at 1004. The slow<0> signal 1006 deasserts at 1007 responsive to the rising edge 1008 of DCO_OUT and the control logic (e.g., the A2 modulator) determination to increase the frequency of DCO_OUT. The output of stage<62> is shown at 1012. The deassertion of slow<0> causes the rising edge of the output of stage<62> at 1014 to occur more quickly thereby causing a shorter period 1015 and a higher frequency. The timing margin is shown at 1016 between the falling edge of slow<0> and the rising edge 1014 of stage<62> out. The shorter period 1015 in turn causes the period 1018 of DCO_OUT to be shorter to thereby provide a higher frequency responsive to deassertion of the slow signal. The slow signal asserts at 1020 responsive to the rising edge of DCO_OUT at 1022 (and the control logic determination to decrease the frequency of DCO_OUT responsive to, e.g., dithering due to the LSBs of the frequency code). The assertion of the slow signal results in the rising edge of stage<62> out at 1024 to occur later thereby making the period 1026 longer. That longer period results in the rising edge of DCO_OUT at 1028 to occur more slowly thereby increasing the period 1030 and decreasing the frequency of DCO_OUT responsive to assertion of the slow signal. Thus, the frequency of DCO_OUT can be seen to increase for two cycles beginning at 1008 and then decrease for the next cycle beginning at 1022. Again, that results in DCO_OUT changing within one DCO cycle of the assertion or deassertion of the slow signal. Thus, the slow signal change at 1007 results in the frequency changing in period 1018 and the deassertion of the slow signal at 1020 results in the frequency changing in period 1030.

Figure 11:
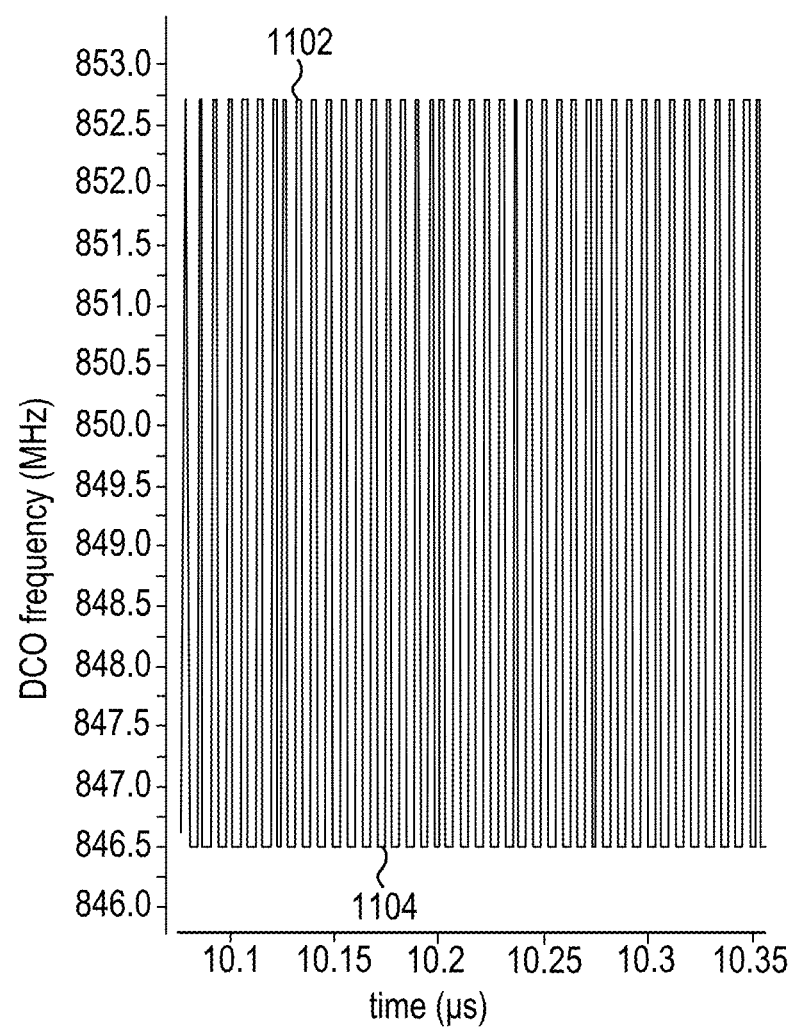
FIG. 11 illustrates another example of the delay free frequency change of the DCO output.

FIG. 11 illustrates another example of the delay free frequency change of DCO_OUT in a manner consistent with dithering based on the least significant bits of the frequency code supplied by the digital loop filter. In the example of FIG. 9 the frequency continually shifts between the high frequency of approximately 852.575 MHZ at 1102 and the low frequency of approximately 8.46.5 MHz at 1104.

Thus, a DCO implemented as a ring oscillator that is dithered at high speed has been described. The description of the invention set forth herein is illustrative and is not intended to limit the scope of the invention as set forth in the following claims. The terms "first," "second," "third," and so forth, as used in the claims, unless otherwise clear by context, is to distinguish between different items in the claims and do not otherwise indicate or imply any order in time, location, or quality. Variations and modifications of the embodiments disclosed herein may be made based on the description set forth herein, without departing from the scope of the invention as set forth in the following claims.

What is claimed is:

1. An apparatus comprising:
a ring oscillator having a plurality of inverter stages and the ring oscillator supplying a ring oscillator output signal;
wherein a first group of the inverter stages is coupled to receive respective frequency control signals to control respective delays through the first group of inverter stages;
wherein a second group of the inverter stages has delays that are static during operation of the ring oscillator;
an accumulator coupled to accumulate least significant bits of a frequency control word and supply a carry out bit; and
an encoder coupled to receive most significant bits of the frequency control word responsive to a first value of the carry out bit and receive the most significant bits of the frequency control word plus one responsive to a second value of the carry out bit and supply the frequency control signals.

2. The apparatus as recited in claim 1 further comprising:
a loop filter of a phase-locked loop configured to supply the frequency control word; and
wherein a frequency of the ring oscillator is dithered according to the least significant bits.

3. The apparatus as recited in claim 2 wherein the encoder is a digital to thermometer encoder coupled to receive an N bit input, the N bit input being the most significant bits of the frequency control word or the most significant bits of the frequency control word plus one, and supply the frequency control signals as an M bit thermometer encoded output, M and N being integers.

4. The apparatus as recited in claim 2 wherein the accumulator has a clock input coupled to an output of the ring oscillator.

5. The apparatus as recited in claim 1 wherein at least some of the second group of the inverter stages are smaller terms of number of devices compared to the first group of the inverter stages.

6. The apparatus as recited in claim 1 wherein an inverter stage of the first group of the inverter stages comprises:
an inverter including a first PMOS transistor coupled between a first node and an output node and the first PMOS transistor having a gate terminal coupled to an input node and an NMOS transistor coupled between the first node and ground, and the NMOS transistor having a gate coupled to the input node; and
a conductive path disposed between a supply voltage and the first node, the conductive path taking on a plurality of conductivities according to a digital control input.

7. The apparatus as recited in claim 6 wherein the conductive path further comprises:
a second PMOS transistor coupled between the supply voltage and the first node, the second PMOS transistor having a gate terminal coupled to ground; and
a third PMOS transistor coupled between the supply voltage and the first node and having a gate terminal coupled to one of the frequency control signals as the digital control input.

8. The apparatus as recited in claim 1 wherein the first group of inverter stages and the second group of inverter stages are equal in number and the ring oscillator further comprises an additional inverter stage to thereby provide an odd number of inverter stages.

9. The apparatus as recited in claim 1 wherein the delays through the first group of inverter stages affect one edge of the ring oscillator output signal, either a rising edge or a falling edge but not both.

10. The apparatus as recited in claim 1 wherein the first group of inverter stages are either even or odd inverter stages.

11. A method comprising:
supplying respective frequency control signals to a first group of inverter stages of a ring oscillator;
controlling respective delays through the first group of inverter stages using the respective frequency control signals;
changing a frequency of a ring oscillator output signal in response to a change in one or more of the frequency control signals;
using static delays during operation of the ring oscillator for a second group of inverter stages of the ring oscillator;

accumulating least significant bits of a frequency control word in an accumulator and supplying a carry out bit from the accumulator;

dithering an output frequency of the ring oscillator according to the carry out bit by supplying either most significant bits of the frequency control word or the most significant bits plus one, as an N-bit input to a digital to thermometer encoder according to a value of the carry out bit; and supplying an M bit thermometer encoded output as the frequency control signals, M and N being integers.

12. The method as recited in claim 11 further comprising supplying a clock input of the accumulator with a signal based on an output of the ring oscillator.

13. The method as recited in claim 12 further comprising:

supplying the carry out bit as a select signal for a selector circuit; and selecting to supply either the most significant bits of the frequency control word or the most significant bits plus one from the selector circuit, according to the select signal.

14. An apparatus comprising:

a ring oscillator including a plurality of inverter stages and configured to supply a ring oscillator output signal;

a first group of inverter stages of the plurality of inverter stages of the ring oscillator are coupled to receive respective frequency control signals to modulate respective delays through the first group of inverter stages;

a second group of inverter stages of the plurality of inverter stages having static delays during operation of the ring oscillator;

wherein most significant bits of a frequency control word are used in generation of the frequency control signals;

an accumulator coupled to accumulate least significant bits of the frequency control word and supply a carry out bit; and wherein a frequency of the ring oscillator output signal is dithered by causing an encoder to receive the most significant bits of the frequency control word or to receive the most significant bits of the frequency control word plus one according to a value of the carry out bit of the accumulator.

15. The apparatus as recited in claim 14 wherein the encoder is a digital to thermometer encoder configured to supply the frequency control signals.

16. The apparatus as recited in claim 14 further comprising:

a time-to-digital converter to supply a phase error indication between a reference clock signal and a feedback signal of a phase-locked loop; and a loop filter coupled to receive the phase error indication and supply to supply the frequency control word.

17. The apparatus as recited in claim 14 wherein the first group of inverter stages and the second group of inverter stages are equal in number and the ring oscillator further comprises an additional inverter stage to thereby provide an odd number of inverter stages.

18. The apparatus as recited in claim 14 wherein the modulation of the respective delays through the first group of inverter stages affects one edge of the ring oscillator output signal, either a rising edge or a falling edge but not both.

19. The apparatus as recited in claim 18 wherein the first group of inverter stages are even inverter stages.

* * * * *